United States Patent
Eguizabal

(10) Patent No.: US 6,504,443 B1
(45) Date of Patent: Jan. 7, 2003

(54) COMMON ANODE VARACTOR TUNED LC CIRCUIT

(75) Inventor: Antonio L. Eguizabal, Grapevine, TX (US)

(73) Assignee: NEC America, Inc.,, Irving, TX (US)

( * ) Notice: Subject to any disclaimer, the term of this patent is extended or adjusted under 35 U.S.C. 154(b) by 0 days.

(21) Appl. No.: 09/573,786

(22) Filed: May 17, 2000

(51) Int. Cl.[7] .............................. H03B 5/08; H03B 5/12; H03B 7/00

(52) U.S. Cl. ................................ 331/177 V; 331/36 C; 333/174

(58) Field of Search .......................... 331/36 C, 116 R, 331/116 FE, 117 R, 117 FE, 177 V, 177 R, 179; 333/174

(56) References Cited

U.S. PATENT DOCUMENTS

| | | |
|---|---|---|
| 3,622,914 A | 11/1971 | Chung et al. |
| 3,852,670 A | 12/1974 | Ma et al. |
| 3,889,210 A | 6/1975 | Matsuura et al. |
| 3,997,848 A | 12/1976 | Rippy |
| 4,002,985 A | 1/1977 | Merrell |
| 4,066,983 A | 1/1978 | Gallani et al. |
| 4,150,344 A | 4/1979 | Fenk |
| 4,249,262 A | 2/1981 | Fenk |
| 4,267,604 A * | 5/1981 | Sato ........................... 455/193 |
| 4,353,038 A | 10/1982 | Rose et al. |
| 4,450,416 A | 5/1984 | Mears |
| 4,500,854 A | 2/1985 | Meyer |
| 4,503,402 A | 3/1985 | Englund, Jr. |
| 4,510,465 A | 4/1985 | Rice et al. |
| 4,536,724 A | 8/1985 | Hasegawa et al. |
| 4,593,255 A | 6/1986 | Matsuura |
| 4,598,423 A | 7/1986 | Hettiger |
| 4,609,884 A | 9/1986 | Kindinger et al. |
| 4,621,241 A | 11/1986 | Kiser |
| 4,673,869 A | 6/1987 | Michael |

(List continued on next page.)

FOREIGN PATENT DOCUMENTS

| | | |
|---|---|---|
| EP | 0 270 298 A2 | 11/1987 |
| EP | 0 351 153 A2 | 7/1989 |
| GB | 2 240 227 A | 7/1991 |
| JP | 7-131367 | 5/1995 |
| JP | 7-303019 | 11/1995 |

OTHER PUBLICATIONS

Knox Semiconductor, Inc., www.knoxsemiconductor.com/1N5441–5476.PDF, "General Purpose Abrupt Caractor Diodes".

Semiconductor Operation, www.microsemi.com/datasheets/s5000189.pdf, pp. 189–192.

"Voltage Variable Capacitance (Tuning) Diodes", www.semitexinternational.com/Semicinductor–Div–/Semi-conductor—Product_Line/Varactors_Pin_Diodes/Varactor_1_2.pdf.

Primary Examiner—David C. Mis
(74) Attorney, Agent, or Firm—Scully, Scott, Murphy & Presser

(57) ABSTRACT

A voltage controlled oscillator circuit in which the principal frequency determining circuit or tuning circuit comprises a pair of common anode varactor diodes. The circuit functions as a variable frequency oscillator controlled by an external DC control voltage, when utilized in conjunction with a parallel connected inductor and bypass or coupling capacitors to an oscillator circuit. This circuit has applicability as a basic building block or subcircuit for use in frequency synthesizer circuits, filter circuits, or the like, and which operate in baseband, I/F or R/F. The oscillator is a type which can be used in cellular or handheld telephones, both digital and analog, and in radio or communication equipment in general. The tuning circuit is symmetrical in form, and can isolate direct current (DC) paths of the tuning circuit from the alternating current (AC) or I/F or R/F current paths of the connected active circuit or drive circuit.

34 Claims, 5 Drawing Sheets

U.S. PATENT DOCUMENTS

| | | | |
|---|---|---|---|
| 4,679,003 A | * 7/1987 | Sagawa et al. ............. 331/1 A |
| 4,703,292 A | 10/1987 | Okanobu |
| 4,709,409 A | 11/1987 | Ma et al. |
| 4,731,592 A | 3/1988 | Sato et al. |
| 4,754,236 A | 6/1988 | Mamodaly et al. |
| 4,827,226 A | 5/1989 | Connell |
| 4,904,964 A | 2/1990 | Peng et al. |
| 4,924,195 A | 5/1990 | Gonda |
| 4,926,144 A | 5/1990 | Bell |
| 4,969,210 A | 11/1990 | Hansen et al. |
| 4,973,922 A | 11/1990 | Embree et al. |
| 5,019,791 A | 5/1991 | Cohen |
| 5,075,644 A | 12/1991 | Calvin |
| 5,138,285 A | 8/1992 | Michels |
| 5,173,835 A | 12/1992 | Cornett et al. |
| 5,248,948 A | 9/1993 | Shiga |
| 5,254,958 A | 10/1993 | Flach et al. |
| 5,272,525 A | 12/1993 | Borchardt et al. |
| 5,329,256 A | 7/1994 | Higgins, Jr. |
| 5,373,259 A | 12/1994 | Hackman et al. |
| 5,418,503 A | 5/1995 | Glazebrook |
| 5,440,276 A | 8/1995 | Kim |
| 5,471,652 A | 11/1995 | Hulkko |
| 5,481,229 A | 1/1996 | Connell et al. |
| 5,486,796 A | 1/1996 | Ishikawa et al. |
| 5,493,715 A | 2/1996 | Humphreys et al. |
| 5,534,825 A | 7/1996 | Goma et al. |
| 5,535,443 A | 7/1996 | Wignot |
| 5,561,398 A | 10/1996 | Rasmussen |
| 5,650,754 A | 7/1997 | Joshi et al. |
| 5,694,092 A | 12/1997 | Oba et al. |
| 5,708,394 A | 1/1998 | Karlquist |
| 5,731,745 A | 3/1998 | Parham |
| 5,760,656 A | 6/1998 | Sutliff et al. |
| 5,852,384 A | * 12/1998 | Sakakura et al. ............. 331/48 |
| 5,963,842 A | * 10/1999 | Kinugawa ................... 455/3.2 |
| 5,982,243 A | * 11/1999 | Pope ........................... 331/59 |
| 5,999,061 A | * 12/1999 | Pope et al. ................... 331/49 |
| 6,046,647 A | 4/2000 | Nelson |
| 6,046,650 A | 4/2000 | Lichterfield |
| 6,081,168 A | 6/2000 | Park |
| 6,091,309 A | 7/2000 | Burke et al. |
| 6,100,770 A | 8/2000 | Litwin et al. |
| 6,194,976 B1 | * 2/2001 | Cantey, III et al. |
| 6,225,871 B1 | 5/2001 | Chien |
| 6,268,779 B1 | * 7/2001 | van Zeijl ............. 331/117 FE |

* cited by examiner

COMMON ANODE VARACTOR TUNED LC CIRCUIT

BACKGROUND OF THE INVENTION

1. Field of the Invention

The present invention relates generally to varactor tuned LC circuits, and more particularly relates to voltage controlled oscillator (VCO) circuitry with dual varactor diodes having a common anode configuration.

2. Prior Art

Shown in FIG. 1 is a prior art high frequency tuning subcircuit wherein a positive control voltage Vc is applied to node 50 to vary the voltage at node 17. Optional capacitor 27 may be used to filter certain high frequency effects on node 50 to ground node 19, thereby maintaining an average direct current (DC) voltage at node 17 of approximately Vc. Varactor diodes 13 and 15 are connected in a common cathode manner at node 17 and are each bias controlled by Vc. Tuning inductor 82 in conjunction with the equivalent capacitance of the varactor diodes is used to set the resonant frequency of the subcircuit shown in FIG. 1. The subcircuit is subsequently coupled to an active circuit or drive circuit (not shown) using a coupling capacitor 37 at node 77. The frequency response of the subcircuit thereafter varies in response to the varying capacitances of varactor diodes 13 and 15, and in response to the charge transfer which occurs between tuning inductor 82 and varactor diodes 13 and 15.

SUMMARY OF THE INVENTION

It is an object of the present invention to provide varactor tuned LC circuits capable of providing a control signal or differential control signals for providing signal control of an oscillator circuit.

It is also an object of the present invention to provide a tuning circuit used with a voltage controlled oscillator wherein the control voltage is of a similar polarity as other circuits connected to the power source.

It is another object of the present invention to provide a tuning circuit for providing variable tuning of an associated circuit or active circuit such as voltage controlled oscillators, frequency filters, or the like.

It is yet another object of the present invention to provide a tuning circuit or subcircuit which provides variable capacitive tuning where the effective capacitance seen at the input node for the control voltage or modulation voltage into the tuning circuit is approximately twice the actual capacitance of the variable tuning device or approximately twice the actual capacitance of a varactor diode, particularly when matched devices are used in the tuning circuit or subcircuit.

In accordance with the teachings herein, the present invention provides a voltage controlled oscillator circuit in which the frequency determining circuit or tuning circuit comprises a pair of varactor diodes connected in a common anode configuration and optionally is fabricated in a single semiconductor substrate or package. The tuning circuit is implemented in conjunction with an inductor and coupling capacitors to form a variable frequency oscillator controlled by a control voltage. This circuit may also be used as a subcircuit which has applicability as the basic building block for a frequency synthesizer, a frequency filter, or the like. The circuit can be tuned such that frequency synthesizer, filter, or the like, operates at baseband frequencies, intermediate frequencies (I/F) or radio frequencies (R/F). These various frequency synthesizers, filters, and the like are presently used in cellular or hand held telephones, including digital and analog type telephones, and may be implemented in other radio or communication equipment in general.

The present invention offers, either separately or in combination, the following advantages:

1) a common anode connection node whereby the externally applied control voltage Vc applied to the control node will typically be a positive voltage with respect to a common ground node;
2) a circuit configuration which has basically symmetrical operating characteristics, particularly where matched component properties or matched components are used for corresponding circuit elements or components;
3) a tuning circuit or subcircuit capable of being isolated from the direct current (DC) ground of the active circuit or oscillator drive circuit thereby permitting separate DC bias of the tuning circuit or subcircuit and the active circuit or oscillator drive circuit while maintaining the symmetry of the circuit configuration; and, when matched components are used in the tuning circuit or subcircuit, the following advantages are also of note:

4) the capacitance of the varactor diodes are effectively in parallel for the control or modulation voltages; and,
5) the varactor diodes are effectively in series for alternating current (AC) signals such as radio frequency R/F signals and for resonant frequency determination.

The foregoing objects and advantages of the present invention for a varactor tuned LC circuit may be more readily understood by one skilled in the art with reference to the following detailed description of the preferred embodiment thereof, as shown by the accompanying drawings wherein like elements are designated by identical reference numerals throughout the several views.

DETAILED DESCRIPTION OF THE PREFERRED EMBODIMENTS

Figure 1:
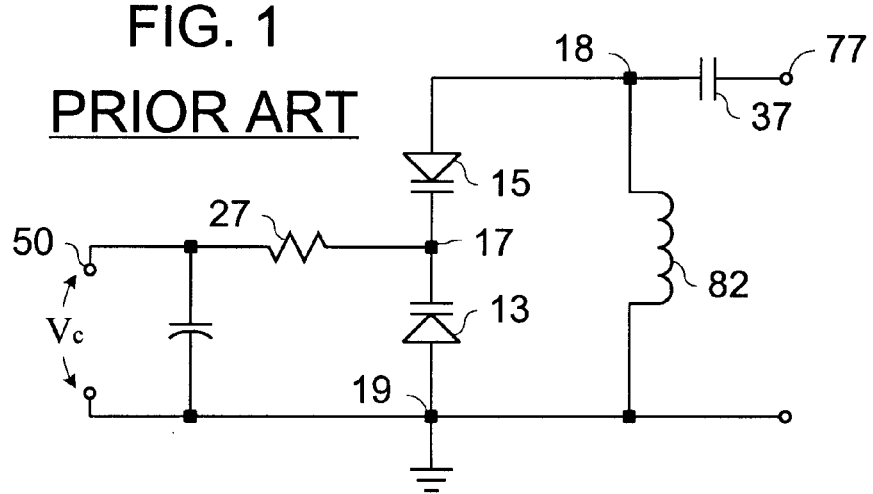
FIG. 1 illustrates a prior art tuning circuit or subcircuit and which is used for tuning the frequency response of another circuit (not shown).
Figure 2:
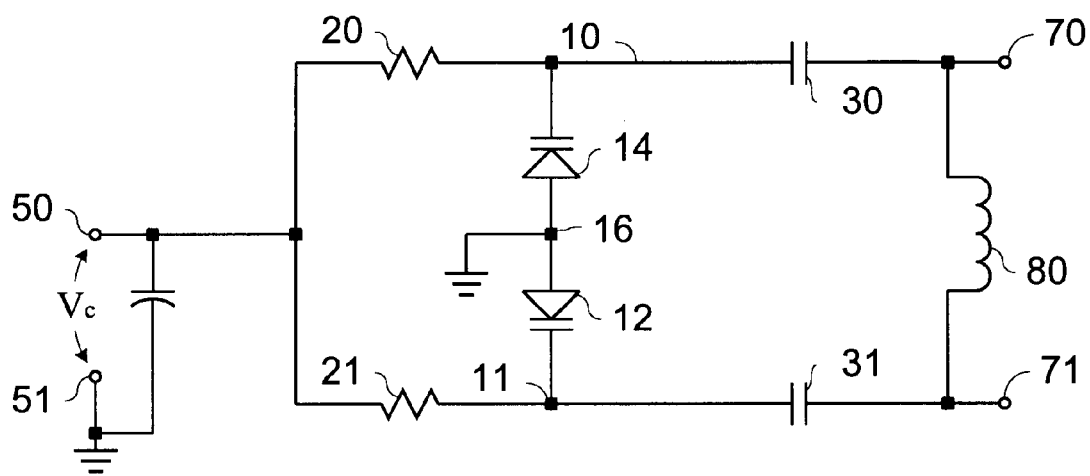
FIG. 2 illustrates an embodiment of the present invention which comprises a tuning circuit or subcircuit having a pair varactor diodes configured to have a common anode connection.

FIG. 2 illustrates a preferred embodiment of the present invention which comprises a high Q tuned circuit having a pair of first and second varactor diodes 12 and 14 connected in a common anode configuration and connected at common ground node 16. The pair of varactor diodes each change their capacitance or reactance in response to an applied external control voltage Vc thereby controlling the resonant frequency of a connected oscillator drive circuit (not shown) or the operating characteristics of a connected active circuit (not shown).

Figure 3:
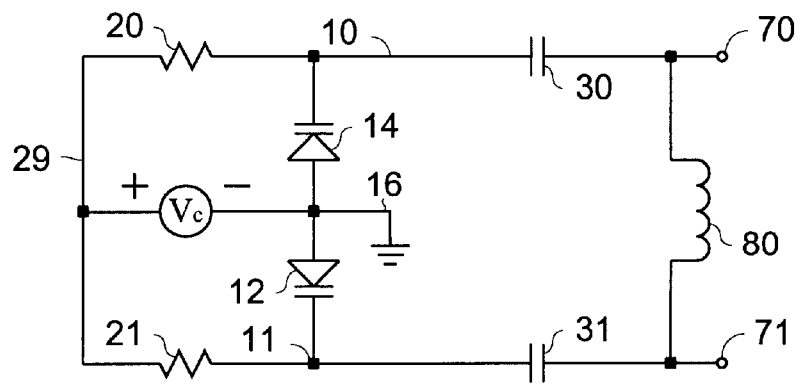
FIG. 3 illustrates a DC or low frequency equivalent circuit for FIG. 2.

Shown in FIG. 3 is the DC equivalent of FIG. 2 and as connected to tuning inductor 80 using coupling capacitors 30 and 31. Where the DC leakage currents of coupling capacitors 30 and 31 are negligible or can be ignored, the DC circuit further reduces to the equivalent circuit shown in FIG. 4. By DC isolating tuning inductor 80, the inductor 80 can be part of the circuitry of oscillator drive circuit or active circuit connected to the tuning circuit or subcircuit, e.g., where the tuning circuit or subcircuit is implemented as a semiconductor device. Alternatively, the tuning inductor 80 can be included as part of the tuning circuit or subcircuit, e.g., where the oscillator drive circuit or active circuit is completely implemented in a semiconductor device and the tuning circuit or subcircuit is implemented by discrete devices. When implementing the varactor diodes in semiconductor material, it is desirable to form the varactors such that the common ground anode of the varactors is in or on an electrical ground plane within the semiconductor material, such that a portion of the semiconductor material is in contact with the common anode and functions as a thermal sink to the varactor diodes.

Figure 4:
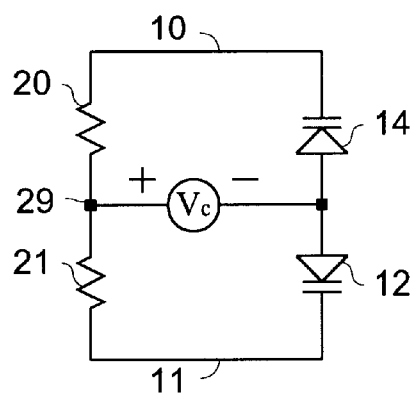
FIG. 4 illustrates a DC equivalent circuit for DC bias and varactor diode leakage currents of the circuit for FIG. 2.
Figure 5:
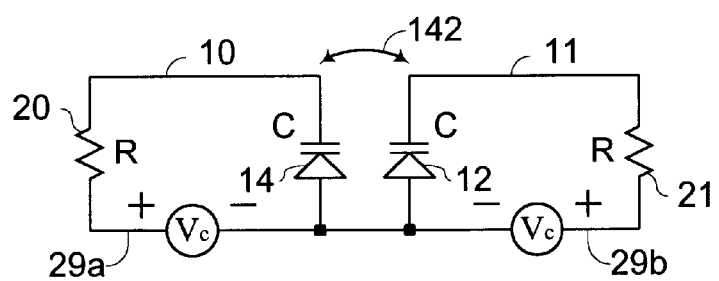
FIG. 5 illustrates an equivalent circuit of FIG. 4 when matched varactor diodes are used in the tuning subcircuit.

During the normal operation of the tuning circuit or subcircuit, the varactor diodes as shown in FIG. 4 are reversed biased, and therefore the DC current supplied from voltage source Vc is limited to the sum of the individual leakage currents of the individual varactor diodes (plus the leakage currents of the coupling capacitors 30 and 31, ideally zero). When the coupling capacitor leakage currents can be ignored, then FIG. 4 can be diagrammatically rearranged to derive FIG. 5 by instantiating a second voltage source Vc identical to the original voltage source Vc and by dividing node 29 into equivalent nodes 29a and 29b.

Where the reversed bias leakage currents of the varactor diodes 12 and 14 are similar or matched, and where the input resistors 20 and 21 are likewise similar or matched, then nodes 10 and 11 as shown in FIG. 5 operate at the same DC potential, thereby creating virtual node 142 which effectively connects nodes 10 and 11. Consequently, the circuit of FIG. 5 can be further reduced to that of FIG. 6. Essentially, where the leakage current of the coupling capacitors can be ignored, then the reversed bias leakage currents of the varactor diodes is the only DC current flowing through the voltage source Vc.

Figure 6:
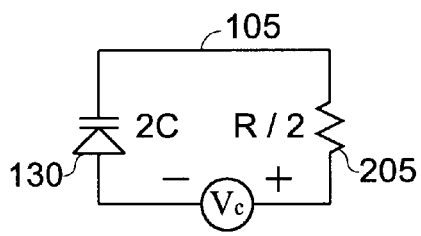
FIG. 6 illustrates an effectively equivalent circuit of the circuit of FIG. 5, when matched components are used.

As can be seen from the circuit of FIG. 6, the varactor diodes, for DC purposes are effectively in parallel. Input resistors 20 and 21 reduce to the single input resistor 205 while varactor diodes 12 and 14 reduce to the single varactor diode 130 having a capacitance which is the sum of the capacitances of varactor diodes 12 and 14. It should be noted that for small values of varactor diode leakage current(s) times the input resistance of input resistors 20 or 21, then the DC voltage drop across each of the input resistors 20 and 21 is likely negligible compared to a fixed control voltage Vc and varactor diodes 12 and 14 each effectively see the control voltage Vc as the DC voltage across each varactor diode.

Figure 7:
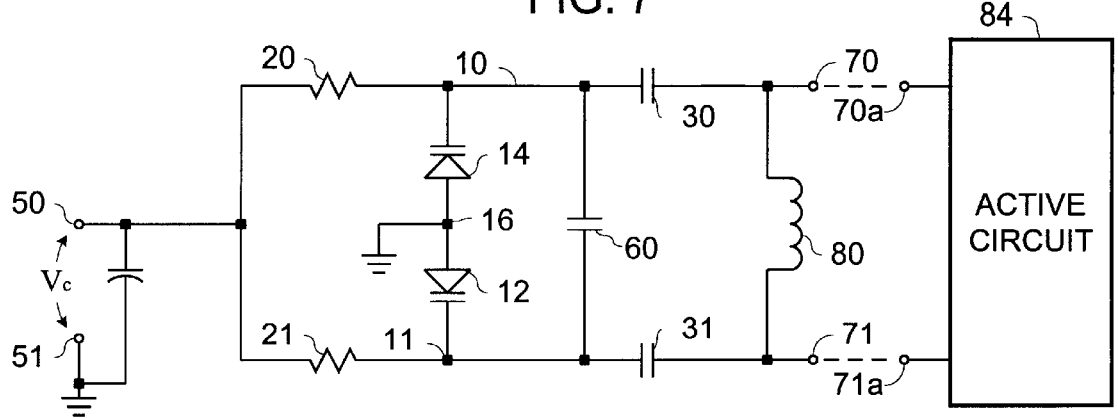
FIG. 7 illustrates another embodiment of the present invention.

Shown in FIG. 7 is a second preferred embodiment of the invention. As shown by FIG. 7, the tuning circuit or subcircuit of FIG. 2 is modified by the addition of a frequency limiting capacitor 60. The tuning circuit or subcircuit has no direct current paths to active circuit 84, but as shown does have a direct current path through tuning inductor 80 when nodes 70 and 70a are directly connected and when nodes 71 and 71a are directly connected. In an alternative embodiment, an additional coupling capacitor can be inserted between nodes 70 and 70a and a second additional coupling capacitor can also be inserted between nodes 71 and 71a thereby eliminating tuning inductor 80 from the DC path of active circuit 84.

Figure 8:
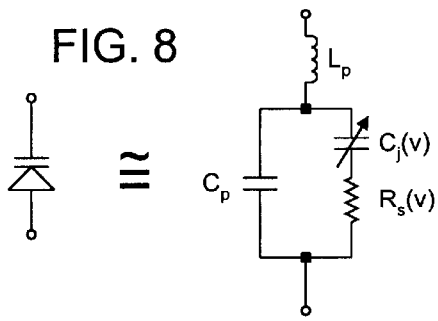
FIG. 8 illustrates a high frequency or AC equivalent circuit of a reversed biased varactor diode.
Figure 9:
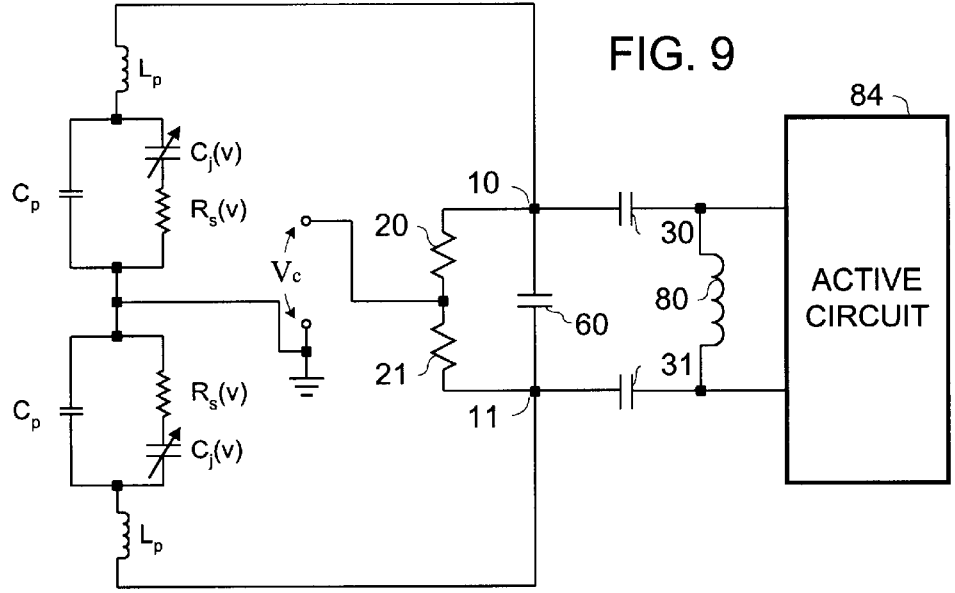
FIG. 9 illustrates the high frequency or AC equivalent circuit of FIG. 7 wherein the equivalent circuit of FIG. 8 substituted for the varactor diodes in FIG. 7.
Figure 10:
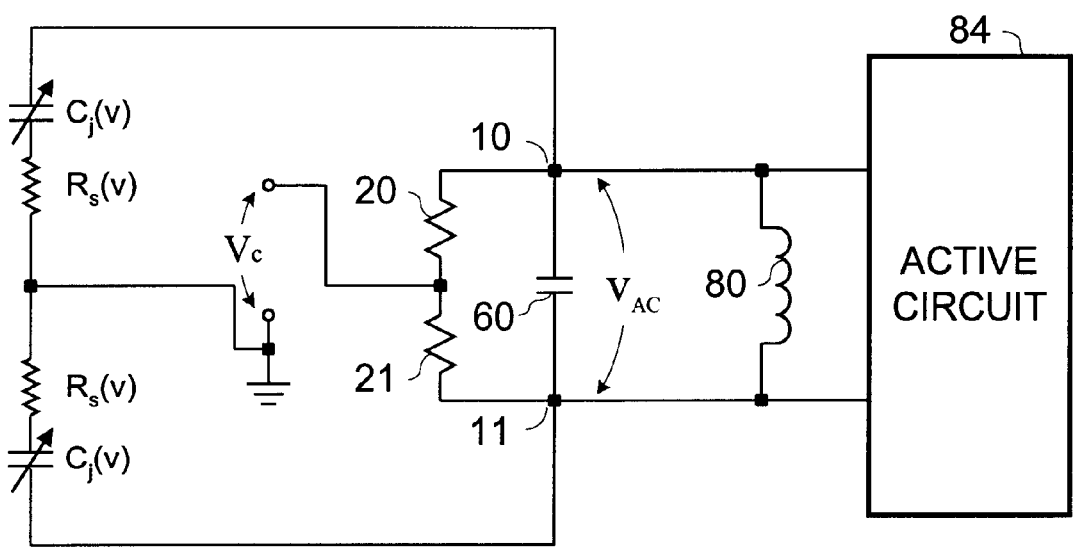
FIG. 10 illustrates the high frequency or AC equivalent circuit of FIG. 9 wherein parasitic components are negligible or ignored.

Shown in FIG. 8 is an alternating current (AC) approximation circuit for a varactor diode. A series parasitic inductor Lp connects from the cathode of the varactor diode to a small signal variable capacitor Cj and a parasitic capacitance Cp. The small signal variable capacitor Cj connects in series with a small signal variable resistor Rs, both of which connect in parallel with the parasitic capacitance Cp at the anode of the varactor diode. By substituting the approximation circuit of FIG. 8 into the circuit shown in FIG. 7, an approximate AC or small signal equivalent circuit is shown in FIG. 9.

Where the AC or small signal effects of coupling capacitors 30 and 31 can be ignored, and where the parasitic effects of the parasitic inductors and parasitic capacitors can also be ignored, FIG. 9 simplifies to the small signal equivalent circuit as shown in FIG. 10.

As also shown in FIG. 10, the AC or small signal voltage across tuning inductor 80 effectively sees a small signal variable capacitor in series with a small signal variable resistor Rs which is connected to ground node 16 and thereafter connected in series to a second small signal variable resistor Rs also connected in series to a second small signal variable capacitor, thereby completing the circuit loop.

Therefore, in the high Q tuned circuits of FIG. 2 and FIG. 7, the varactor diodes 12 and 14 are effectively connected in series for an AC or small signal or an R/F voltage, while simultaneously the varactor diodes are effectively connected in parallel for a control voltage Vc or a modulation voltage.

As is generally well known in the art of semiconductor processing, varactor diodes 12 and 14 can be formed in a single substrate material to provide the matched device parameters such that the circuit operation of the tuning circuit or subcircuit is substantially symmetrical in nature. It is also possible, but not necessarily preferred, to implement the inventive concepts as applied to the circuits described herein without matched varactor diodes and/or other matched circuit devices or elements.

Furthermore, the DC and AC operating characteristics of varactor diodes is also well known to those who practice in these arts; therefore, these operating characteristics have not been discussed in detail to permit clarity herein of the inventive concepts described herein.

Figure 11:
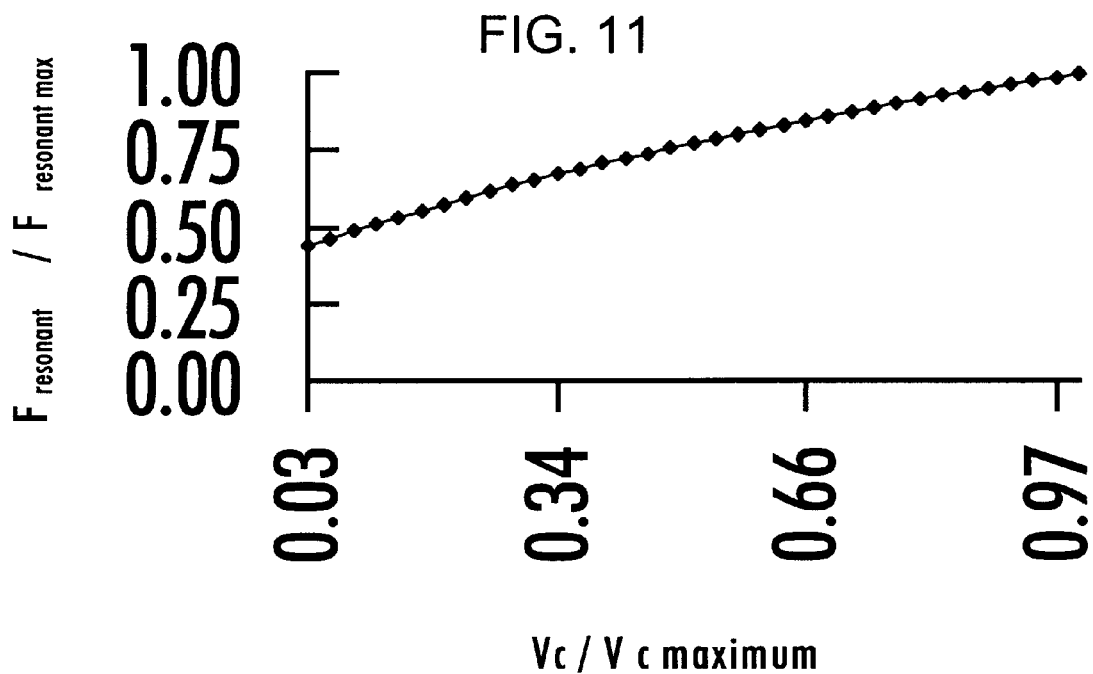
FIG. 11 illustrates a calculated resonance frequency response of the tuning circuit of FIG. 2 normalized to the maximum calculated resonance frequency and maximum control voltage for varactor diodes having a gamma equal to one.
Figure 12:
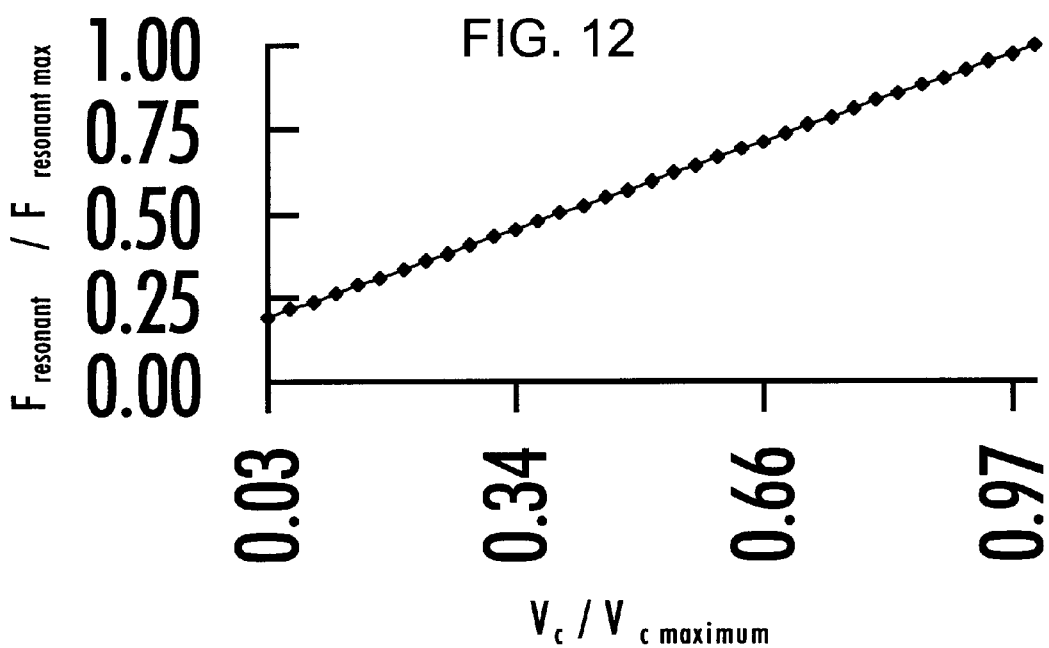
FIG. 12 illustrates another calculated resonance frequency response of the tuning circuit of FIG. 2 normalized to the maximum calculated resonance frequency and maximum control voltage for varactor diodes having a gamma equal to approximately two.

Shown in FIGS. 11 and 12 are simulation results of the circuit of FIG. 2 and as connected to a tuning inductor of a circuit such as the oscillator drive circuit or the active circuit described by element 84. FIG. 11 shows a tuning curve calculating the resonant frequency of the circuit of FIG. 2 as a function of applied control voltage Vc when using a varactor diode having a parametric value of one (1) for device parameter gamma (γ). FIG. 12 shows a similar curve comparing the calculated resonant frequency versus applied control voltage for a varactor diode having a gamma(γ)=2, whereby the tuning curve shown in FIG. 12 is substantially linear of a wide range of the applied control voltage, Vc. The addition of parallel capacitor 60, as shown in FIG. 7, will cause the resonant frequencies of FIG. 11 or FIG. 12 to shift to a desired resonant frequency value at a particular control voltage or shift an amount. Additionally, parallel capacitor 60 or one or more capacitors connected in parallel with capacitor 60 may also be used to compensate for temperature variation.

While several embodiments and variations of the present invention for a varactor tuned LC circuit are described in detail herein, it should be apparent to those skilled in the art that the disclosure and teachings of the herein described invention will suggest alternative designs without departing from the inventive concepts as described and claimed.

What is claimed is:

1. A varactor tuning circuit comprising a pair of first and second varactor diodes having a common anode connection connected at a common node which is grounded for direct current (DC) and a shifting capacitor effectively connected to the cathodes of the first and second varactor diodes, wherein the resonant frequency of the tuning circuit is altered by the shifting capacitor and wherein the diodes change their capacitances or reactances in response to an applied voltage thereby effecting the functioning of a connected active circuit and wherein the diodes are effectively connected in parallel to the applied voltage.

2. A varactor tuning circuit as claimed in claim 1, wherein the tuning circuit is isolated from DC current paths of the active circuit.

3. A varactor tuning circuit as claimed in claim 2, wherein the isolation is implemented using one or more coupling capacitors.

4. A varactor tuning circuit as claimed in claim 1, wherein the tuning circuit further comprises at least one parallel connected capacitor.

5. A varactor tuning circuit as claimed in claim 1, wherein the tuning circuit further comprises at least one parallel connected inductor.

6. A varactor tuning circuit as claimed in claim 1, wherein the active circuit is an oscillator drive circuit.

7. A oscillator drive circuit as claimed in claim 6, wherein the tuning circuit operates to provide an oscillating output signal in a frequency range in one or more of the baseband, I/F, or R/F, frequency ranges.

8. A varactor tuning circuit as claimed in claim 1, wherein the active circuit is a filter circuit.

9. A filter circuit as claimed in claim 8, wherein the filter circuit operates to filter an input signal at a resonant frequency in a frequency range in either the baseband, I/F, or R/F, frequency range.

10. A varactor tuning circuit as claimed in claim 1, wherein the tuning circuit operates substantially symmetrically.

11. A varactor tuning circuit as claimed in claim 10, wherein the tuning circuit has components which are parametrically matched.

12. A varactor tuning circuit as claimed in claim 11, wherein the matched components are the varactor diodes.

13. A varactor tuning circuit as claimed in claim 12, wherein the varactor diodes are formed in the same semiconductor substrate.

14. A varactor tuning circuit as claimed in claim 11, wherein the matched components are resistors.

15. A varactor tuning circuit as claimed in claim 11, wherein the active circuit is connected in a radio frequency communication circuit.

16. A varactor tuning circuit as claimed in claim 15, wherein the frequency communication circuit is in a hand-held telephone.

17. A varactor tuning circuit as claimed in claim 1, wherein the first and second varactor diodes are hyperabrupt junction varactor diodes, characterized by an exponential parameter gamma of value approximately equal to two, whereby the variation in resonant frequency over a range of the control voltage is substantially linear.

18. A varactor tuning circuit as claimed in claim 1, wherein the common node is in contact with semiconductor material, and wherein a portion of the semiconductor material in contact with the common node is used as a heat sink for the first and second varactor diodes.

19. A varactor tuning circuit including:
    a first varactor diode and second varactor diode having a common anode connection, the common anode connection connected to a direct current ground node;
    a first input resistor connected to the cathode of the first varactor diode and a control voltage node;
    a second input resistor connected to the cathode of the second varactor diode and the control voltage node;
    a shifting capacitor effectively connected to the cathodes of the diodes;
    a first coupling capacitor connected to the cathode of the first varactor diode; and,
    a second coupling capacitor connected to the cathode of the second varactor diode.

20. The varactor tuning circuit of claim 19 further including an active circuit connected to the first coupling capacitor and the second coupling capacitor and for driving an oscillating output node of the active circuit such that the active circuit is responsive to a resonant frequency and wherein the resonant frequency is controlled by a voltage at the control node.

21. A varactor tuning circuit comprising two hyperabrupt varactor diodes connected in a common anode configuration and two coupling capacitors, each capacitor connected to a cathode of one of the varactor diodes and the active circuit, thereby direct current isolating the active circuit from the tuning circuit, and, wherein the small signal loading of the tuning circuit with respect to a ground node is approximately equal at each of the nodes connecting the active circuit to one of the two coupling capacitors.

22. A varactor tuning circuit as claimed in claim 21, further comprising two resistors, each resistor connected to a cathode of one of the varactor diodes and each connected to a control voltage.

23. A varactor tuning circuit as claimed in claim 21, wherein the tuning circuit further comprises at least one parallel connected capacitor.

24. A varactor tuning circuit as claimed in claim 21, wherein the tuning circuit filter comprises at least one parallel connected inductor.

25. A varactor tuning circuit as claimed in claim 21, wherein the active circuit is an oscillator drive circuit.

26. A oscillator drive circuit as claimed in clam 25, wherein the tuning circuit operates to provide an oscillating output signal in a frequency range in one or more of the baseband, I/F, or R/F, frequency ranges.

27. A varactor tuning circuit as claimed in claim 21, wherein the active circuit is a filter circuit.

28. A filter circuit as claimed in claim 27, wherein the filter circuit operates to filter an input signal at a resonant frequency in a frequency range in either the baseband, I/F, or R/F, frequency range.

29. A varactor tuning circuit as claimed in claim 21, wherein the tuning circuit operates substantially symmetrically.

30. A varactor tuning circuit as claimed in claim 21, wherein the tuning circuit has components which are parametrically matched.

31. A varactor tuning circuit as claimed in claim 30, wherein the matched components are the varactor diodes.

32. A varactor tuning circuit as claimed in claim 31, wherein the varactor diodes are formed in the same semiconductor substrate.

33. A varactor tuning circuit as claimed in claim 32, wherein the active circuit is connected in a radio frequency communication circuit.

34. A varactor tuning circuit as claimed in claim 33, wherein the frequency communication circuit is in a hand-held telephone.

* * * * *